(12) United States Patent
Zachmann et al.

(10) Patent No.: US 8,956,906 B2
(45) Date of Patent: Feb. 17, 2015

(54) METHOD AND DEVICE FOR PRODUCING A SEMICONDUCTOR LAYER

(75) Inventors: Hendrik Zachmann, Leipzig (DE); Karsten Otte, Leipzig (DE); Horst Neumann, Delitzsch (DE); Frank Scholze, Brandis (DE); Lutz Pistol, Taucha (DE)

(73) Assignee: Solarion AG, Zwenkau (DE)

( * ) Notice: Subject to any disclaimer, the term of this patent is extended or adjusted under 35 U.S.C. 154(b) by 188 days.

(21) Appl. No.: 13/580,243

(22) PCT Filed: Feb. 22, 2010

(86) PCT No.: PCT/EP2010/001093
§ 371 (c)(1),
(2), (4) Date: Oct. 30, 2012

(87) PCT Pub. No.: WO2011/100998
PCT Pub. Date: Aug. 25, 2011

(65) Prior Publication Data
US 2013/0045563 A1    Feb. 21, 2013

(51) Int. Cl.
*H01L 21/00* (2006.01)
*H01L 31/0749* (2012.01)
(Continued)

(52) U.S. Cl.
CPC ........ *H01L 31/0749* (2013.01); *C23C 14/0031* (2013.01); *C23C 14/0623* (2013.01);
(Continued)

(58) Field of Classification Search
CPC ............... H01L 21/02491; H01L 21/02631; H01L 21/02568; H01L 31/0322; H01L 31/0749; C23C 14/0031; C23L 14/0623

USPC ................. 438/73, 59, 96; 136/262, 238, 264
See application file for complete search history.

(56) References Cited

U.S. PATENT DOCUMENTS

| 7,935,558 B1 * | 5/2011 | Juliano et al. ........... 438/62 |
| 2004/0104657 A1 | 6/2004 | Kyek |

(Continued)

FOREIGN PATENT DOCUMENTS

| DE | 19902908 A1 | 7/2000 |
| DE | 102005040087 | 3/2007 |

(Continued)

OTHER PUBLICATIONS

Lippold G et al: "Ion beam assisted deposition of Cu(In,Ga)Se2 films for thin film solar cells", Materials Research Society Symposium Proceedings 2001 Materials Research Society US, Bd. 668, 2001, pp. H3.9.1-H3.9.6, XP002641007.

(Continued)

*Primary Examiner* — Michael Trinh
(74) *Attorney, Agent, or Firm* — Harness, Dickey & Pierce, P.L.C.

(57) ABSTRACT

The invention relates to a method and a device for producing a semiconductor layer. The problem addressed is that of increasing the deposition rate of the layer constituents and significantly improving the efficiency of a resulting solar cell. At the same time, the material costs are intended to be reduced. The problem is solved by virtue of the fact that, in a vacuum chamber, metal evaporator sources release Cu, In and/or Ga or the chalcogenide compounds, the latter are focused as metal vapor jets onto the substrate, and Se and/or S emerge(s) in an ionized fashion from a chalcogen low-energy wide-beam ion source and this beam is focused onto the surface of the substrate in such a way that it overlaps the metal vapor jets. A device for carrying out the method is described.

12 Claims, 1 Drawing Sheet

(51) Int. Cl.
*C23C 14/00* (2006.01)
*C23C 14/06* (2006.01)
*H01L 21/02* (2006.01)
*H01L 31/032* (2006.01)

(52) U.S. Cl.
CPC .... *H01L21/02491* (2013.01); *H01L 21/02568* (2013.01); *H01L 21/02631* (2013.01); *H01L 31/0322* (2013.01); *Y02E 10/541* (2013.01)
USPC .................................. 438/59; 438/73; 438/96

(56) References Cited

U.S. PATENT DOCUMENTS

| 2005/0072461 | A1* | 4/2005 | Kuchinski et al. | 136/256 |
| 2005/0183767 | A1* | 8/2005 | Yu et al. | 136/263 |
| 2005/0194036 | A1* | 9/2005 | Basol | 136/252 |

FOREIGN PATENT DOCUMENTS

| EP | 1422740 | A2 | | 5/2004 |
| JP | 05-166726 | | * | 7/1993 |
| JP | 5166726 | A | | 7/1993 |
| JP | 2000144377 | A | | 5/2000 |

OTHER PUBLICATIONS

Otte, K et al:, Flexible Cu(In,Ga)Se$_2$ thin-film solar cells for space application, Thin Solid Films 511-512 (2006) 613-622, Science Direct, Elsevier B.V. 2005.

Hergert F et al:, "Formation reactions of chalcopyrite compounds and the role of sodium doping", Thin Solid Films 515 (2007) 5843-5847, Science Direct, Elsevier B.V. 2006.

Repins I et al:, 19.9%-efficient ZnO/CdS/CuInGaSe$^2$ Solar Cell with 81.2% Fill Factor, Progress in Photovoltaics: Research and Applications 2008:16:235-239, Wiley & Sons, Ltd., 2008.

Kessler J. et al: Baseline Cu(In,Ga)Se$_2$ device production: Control and statistical significance, Solar Energy Materials & Solar Cells 67 (2001) 67-76, Elsevier Science B.V. 2001.

Miyazaki H. et al: Growth of high-quality CuGaSe$_2$ thin films using ionized Ga precursor, Phys. Stat. Sol. (a) 203, No. 11, 2603-2608 (2006), DOI 10,1002/pssa.200669640, Wiley-VCH Verlag GmbH & Co. KGaA, Weinheim, 2006.

International Search Report, ISA/EP, Rijswijk, NL, mailed Jun. 22, 2011.

International Preliminary Report on Patentability (English translation), IB, Geneva, issued Aug. 28, 2012.

* cited by examiner

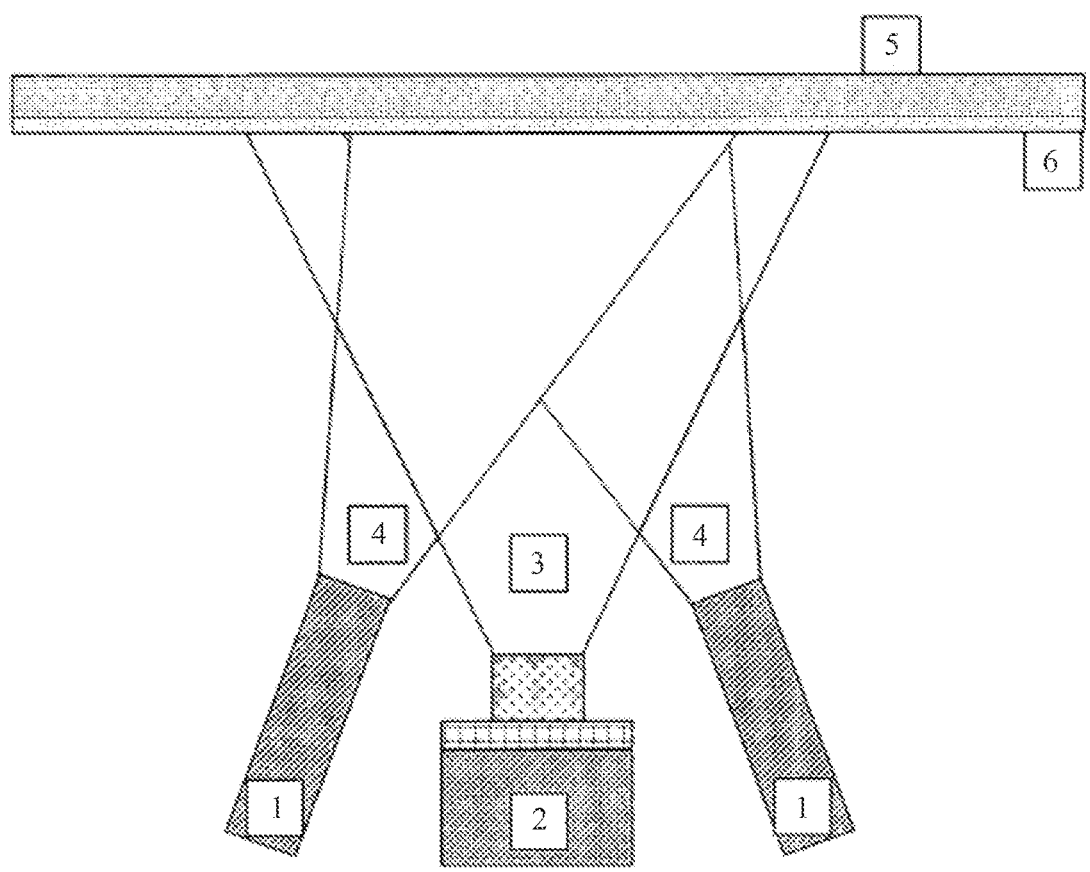

METHOD AND DEVICE FOR PRODUCING A SEMICONDUCTOR LAYER

CROSS-REFERENCE TO RELATED APPLICATIONS

This application is a 371 U.S. National Stage of International Application No. PCT/EP2010/001093, filed Feb. 22, 2010, the disclosure of which is incorporated herein by reference.

FIELD OF THE INVENTION

The invention relates to a method and a device for depositing a chalcopyrite absorber layer for thin layer solar cells on a layer system in a vacuum process, whereby a special low-energy broad-beam ion source is used for the production. The development of highly efficient solar cells as well as their economical production are main goals of photovoltaic. In the course of this development thin-layer solar cells are becoming more and more significant and will open up larger areas of the market in the future that is currently dominated by crystalline silicon solar cells.

BACKGROUND OF THE INVENTION

A promising absorber material for use in thin-layer solar cells is the material system of the chalcopyrite semiconductors I-IIII-VI$_2$ with the currently most widespread representative CuInSe$_2$ and its alloy Cu(In,Ga)Se$_2$. A current construction for thin layer solar cells based on this absorber material consists of a glass substrate on which a metallic back contact of molybdenum is applied; the chalcopyrite absorber layer follows in a thickness of customarily 1-3 µm, a cadmium sulfide buffer layer on it and finally a transparent, conductive front contact, for example, of aluminum-doped zinc oxide. Such solar cells achieve efficiencies of up to 19.9% in the laboratory.

Instead of the rigid glass substrate, flexible substrates of metal sheets or polymer sheets have proven themselves. Independently of the selection of the substrate, only substrate will be used in the following. The illustration 1 on page 616 in can serve as an example for the construction of a flexible Cu(In,Ga)Se$_2$ solar cell on a polyimide sheet.

Various methods are known for the deposition of the Cu(In,Ga)Se$_2$ absorber layer. For example, the metallic components copper, indium and gallium are made available in a sequential process by previously deposited precursor layers. This layer stack is subsequently chalcogenized by being rapidly heated up in an atmosphere of selenium. During the simultaneous deposition by a co-evaporation the metallic components as well as the chalcogen component (selenium or sulfur) are simultaneously deposited. In addition, a deep element gradient can be produced in the absorber layer by a purposeful arrangement of the metallic evaporators which raises the efficiency of the thin-layer solar cell.

As a rule the substrate is heated in the deposition processes.

Furthermore, it is known in the simultaneous or sequential deposition of Cu(In,Ga)Se$_2$ as absorber material for thin-layer solar cells that the selenium component can be made available by an ion beam. For this, on the one hand the selenium component is made available in a more reactive form than it would be in the case of evaporation of pure selenium. On the other hand an additional, non-thermal energy contribution for layer growth is made available by the energetic selenium ions. This has a positive influence on the layer growth and results in a higher quality of the polycrystalline absorber with a simultaneously reduced substrate temperature.

Furthermore, it is known that in the deposition of Cu(In,Ga)Se$_2$ only gallium can be offered in ionized form. This has a positive influence on the layer growth and the qualities of the absorber layer. The gallium ions originate from a gallium ion beam source.

Furthermore, solid ion beam sources are known that can generate ions for research purposes from materials with a high evaporation point (e.g., copper and indium). The rate (i.e. evaporation rate) as well as the ion current density of these sources are very low and therefore not suitable for the layer deposition on an industrial scale.

Furthermore, a method is known that contains the co-evaporation of copper, indium, gallium and selenium. In the resulting vapor phase the elements are mixed, whereby during the evaporation in the space between the evaporator sources and the substrate a plasma is ignited and maintained. This results in an ionization and excitation of all layer-forming elements. In the production of Cu(In,Ga)Se$_2$ absorber layers by co-evaporation, according to the state of the art as a rule pure metallic and chalcogenic vapors are used in a vacuum for the introduction of Cu, In, Ga and Se into the absorber layer. The latter have a lower reactivity in the Cu(In,Ga)Se$_2$ formation of the absorber layer than excited and/or ionized Cu, In, Ga— or Se components. The layer growth and therewith also the process of crystallite formation are not additionally energetically influenced. For this reason an additional, conventional thermal heating of the substrate during the deposition is necessary. As a rule, temperatures up to 550° C. are used for the recrystallization of the absorber. Therefore, on the one hand a deposition on temperature-sensitive substrates (such as, for example, polyimide sheet), that can therefore only be heated to a low extent is not possible or only possible with a considerably lesser efficiency of the solar cells. On the other hand, high energy costs accumulate during the production of the Cu(In,Ga)Se$_2$ absorber layers on account of the high substrate temperatures.

The simultaneous excitation and/or ionization of all layer-forming components (Cu, In, Ga, Se) in the coating chamber by means of an additional plasma excitation can only partially solve this problem. As the reactivity of the layer-forming elements is elevated, however, an additional, non-thermal energy contribution into the growing Cu(In,Ga)Se$_2$ layer cannot take place on account of the low energy of the ionized and/or excited particles of only a few eV i.e., high substrate temperatures continue to be required for a sufficiently good crystal quality. A further disadvantage of this process is the fact that as a result of the homogenous mixing of the metallic vapors and chalcogenic vapors the adjusting of a deep distribution of the elements, that is advantageous for the electrical qualities of the absorber layer, is not possible. Furthermore, no purposeful deposition on a substrate but, additionally, even on the inner wall of the coating chamber takes place, which elevates the consumption of material and therefore the material expenses in the production of economical thin-layer solar cells.

The solid ion beam sources known from the state of the art would make possible an ionization of all metallic components and chalcogenic components; however, these ion sources are very expensive and an individual ion source would have to be used for each component. The use of these additional ion beam sources for the individual metallic elements consequently has a very high cost for investment and control. This results in a distinct rise of the production costs. Furthermore, these sources do not make possible a deposition of large-area absorber layers since on the one hand their exit opening is as a rule limited to a diameter <10 cm and on the other hand the solid ion sources have too small a density of the ion current and they can therefore not make available amounts of material that are necessary for an economical production. Furthermore, the ion energies that can be adjusted with these sources are also clearly above the ion energies required for the absorber deposition process. The lowering would mean additional expenditures.

The use of an individual broad-beam ion source for the chalcogen component does allow an additional non-thermal making available of energy in the growing layer and therefore the use of lower substrate temperatures; however, the metallic components (Cu, In and/or Ga) continue to be offered in their non-reactive form. This reduces the growth rate of the absorber layer.

SUMMARY OF THE INVENTION

The invention has the goals of reducing the expenses for the production of thin-layer solar cells and at the same time increasing the efficiency of the thin-layer solar cells.

The problem of the invention consists in raising the efficiency of the solar cell as well as the deposition rate when using a low substrate temperature. At the same time the material costs should be reduced during the production.

This is achieved in that during the deposition of the Cu(In, Ga)Se$_2$ absorber layer the chalcogen component is offered as a chalcogen ion beam and at the same time the metallic component is partially or completely ionized or excited. The simultaneous excitement/ionization of the metallic component is achieved in that the distribution of the chalcogen ion beam partially or completely overlaps in the coating chamber with that of the metallic components. An additional feature of the invention is the use of a chalcogenic low-energy ion beam ion source whose extraction lens is adapted in such a manner that chalcogen ions as well as electrons are produced with a sufficient energy and extracted in order to partially or completely excite and/or ionize the vapor of the metallic components.

A significant advantage of the invention is the fact that the excitation and/or ionization of all metallic and chalcogen components required for the layer formation result in an improvement of the structural and therefore of the electrical layer qualities of the deposited absorber layer. The improving of the electrical layer qualities achieves an efficiency of the solar cells that is increased by 10%. Compared to a pure co-evaporation process an efficiency increase of approximately 35% is achieved. Thus, the yield of the solar cell can be decisively increased while retaining the same absorber surface. Another advantage is the use of only one single wide-beam ion source in the coating chamber. Thus, the costs for investment, regulation and control are distinctly reduced in comparison to the using of several individual ion beam sources and the coating technology is also distinctly simplified. Compared to a pure plasma coating by the generation of a plasma inside the coating chamber the material costs are reduced since the coating takes place in a directed manner and thus only the substrate surface is coated to the greatest possible extent. At the same time the selenium ion beam supplies additional, non-thermal energy into the absorber layer being deposited, which makes possible a reduction of the thermal substrate heating and therefore a reduction of the energy costs.

The extraction lens used has the advantage over a traditional grid system of lesser acquisition costs as well as reduced maintenance costs.

BRIEF DESCRIPTION OF THE DRAWINGS

FIG. 1 serves to illustrate a possible procedure of a method.

DETAILED DESCRIPTION OF THE DRAWINGS

The invention is explained in the following using an exemplary embodiment.

Example of a Procedure of a Method

A substrate 5 provided with a molybdenum back contact 6 is placed into the coating chamber. The layer thickness of the molybdenum back contact 6 is in the range between 0.5 and 2 μm.

Now, a Cu(In,Ga)Se$_2$ semiconductor layer is applied in a vacuum process at a pressure between $1 \cdot 10^{-6}$ and $1 \cdot 10^{-4}$ mbar onto the metallic back contact 6. The metallic components from metallic evaporator sources 1 are evaporated at a rate ratio of 0.81<Cu/(In+Ga)<0.95. The selenium required for the layer formation is made available by an ion beam 3 from a low-energy broad-beam ion source 2. The energy of the selenium ions can be selected in the range between 10 and 500 eV.

The substrate holder is heated in this coating step to a temperature between 400 and 550° C.

An overlapping of the metal vapor beams and of the selenium ion beam is achieved by the alignment of the metal evaporator 1 and of the beam guidance 4 resulting from it as well as by the alignment of the ion beam source 2 provided with a special extraction system and by the resulting form and distribution of the selenium ion beam and of the extracted electrons 3. The extraction system of the ion beam source used here consists of a grid with 20 holes whose diameter is 20 mm. A voltage is applied to the extraction system relative to the mass and to the substrate. In the overlapping area the metal vapor components are ionized and/or excited and also reach the surface in this ionized and/or excited state. The deposition of the Cu(In,Ga)Se$_2$ connection semiconductor now takes place in an element- and energy ratio advantageous for the electrical qualities of the layer. The process speed and evaporator rates are coordinated with each other here in such a manner that the resulting Cu(In,Ga)Se$_2$ layer thickness is between 1 and 3 μm.

The layer formation of the Cu(In,Ga)Se$_2$ absorber layer is positively influenced by the striking of the metallic components and of the selenium component in an ionized and/or excited manner with an additional, non-thermal energy. Better layer qualities are produced than would be the case with the using of pure-non-ionized/excited metal vapors and/or selenium ions. A higher deposition rate is also possible. The following table shows the results of this exemplary embodiment in comparison to the results achieved in accordance with the state of the art.

|  | Substrate temperature [° C.] | Solar cell efficiency [%] | Growth rate [nm/min] |
| --- | --- | --- | --- |
| Pure co-evaporation process | 350-450 | 10.1 | 120 |
| Only selenium ionic beam | 350-450 | 12.1 | 180 |
| Method of the invention | 350-450 | 13.7 | 250 |

The degree of the ionization and/or excitation can be adjusted by a suitable selection of the process parameters at the low-energy wide-beam ion source. For example, the extraction of the chalcogen ion beam can take place via an extraction system consisting of an aperture of different dimensions specially adapted to the process. This aperture makes it possible to adjust the direction and the energy of the particles (ions, electrons and neutral particles) generated in the chalcogen-low-energy broad-beam ion source on the way to the substrate in such a manner that the excitation and/or ionization of the metal-vapor component is influenced in accordance with the invention.

Of course, the method in accordance with the invention is not limited to the material system $Cu(In,Ga)Se_2$ but rather can be used to produce all semiconductor layers of the group $I$-$III$-$VI_2$. A possible element of group I that can be used for the deposition of absorber layers is, in addition to copper, silver; a possible element of group III is, in addition to indium and gallium, aluminum. The complete or partial replacement of selenium as a group VI element by sulfur or tellurium is also possible.

Flexible substrates (plastic sheets or metallic sheets) as well as rigid substrates (such as, e.g., glass) can also be used as substrate. Also, the substrate can be moved or remain rigidly fixed during the coating.

According to the invention the extraction system for the low-energy, broad-beam ion source can also have only one opening or several openings with a diameter between 1 mm and 5 cm. Furthermore, the opening can also have another shape (rectangle, etc.).

The evaporators for the metallic components can be arranged in any sequence. Also, any positioning of the evaporators relative to the low-energy, wide-beam ion source with retention of an overlapping range is possible. The thermal evaporation of the metallic components can take place according to the invention by punctual evaporators as well as by linear evaporators.

Also, the evaporation of the metallic components can take place separately from the coating with the chalcogenic component. For this the low-energy, broad-beam ion source is operated with an inert auxiliary gas (e.g., argon) instead of with selenium so that the vapor beams of the metallic elements copper, indium gallium used pass the energetic electrons and ions arising from this source and are therefore also excited and/or ionized. The components of the inert gas used are only moderately inserted during the layer formation. This moderate insertion can be varied by the selection of the inert auxiliary gas.

Another possibility for the ionization and/or excitation of the metallic components without using its own ion beam source for each element consists in introducing a plasma excitation into the chamber itself and therefore generating the plasma of the metallic components themselves. This additional excitation can be carried out either instead of or together with the chalcogenic low-energy, wide-beam ion source.

The invention claimed is:

1. A method for the production of a $Cu(In,Ga)(Se_2)$ semiconductor layer as an absorber layer for thin-layer solar cells by deposition of Cu, In, Ga, Se and S on a substrate that carries a back contact, the method comprising:

building up an absorber layer on the substrate in a coating chamber in such a manner that at first a vacuum between $1\times10^{-6}$ and $1\times10^4$ mbar is generated, wherein the substrate is heated to 200 to 600° C.;

evaporating metallic components including Cu, In and/or Ga, and/or chalcogenide compounds of Cu, In, and/or Ga, in metal evaporator sources to generate metal vapor beams and focusing the metal vapor beams onto the substrate in such a manner that the metal vapor beams strike a surface of the substrate;

discharging selenium and/or sulfur in an ionized manner, in an ion beam, from a chalcogen ion source such that the ion beam strikes the surface of the substrate focused in such a manner that the ion beam overlaps with the metal vapor beams; and extracting, in addition to chalcogen ions in the ion beam, electrons from the ion source, wherein distribution of the electrons also overlaps with the metal vapor beams in the coating chamber and results in an ionization and/or excitation of the metal vapor beams, whereby the deposition of the absorber layer is caused by the energy introduced by the ion beam.

2. The method according to claim 1, wherein the back contact has a molybdenum layer having a thickness of 0.5 to 2 μm, such that a ratio of the metallic components Cu to In and/or Ga is between 0.81 and 0.95, an energy of particles of the selenium is selected to be between 10 and 500 eV, and a temperature of the substrate during the deposition is between 400 and 550 degrees C.

3. The method according to claim 1, wherein the Cu is partially exchanged by Ag, the Ga is partially exchanged by Al and the Se is partially exchanged by S or Te.

4. The method according to claim 1, wherein Cu, In and/or Ga are deposited as precursor layers using the ion source operated with an inert gas, and a $Cu(In,Ga)(Se,S)_2$ absorber layer is not produced until the striking of the beam in a second step.

5. The method according to claim 1, wherein the substrate is moved during the deposition.

6. The method according to claim 1, wherein the substrate is flexible.

7. The method according to claim 1, further comprising providing a plasma from a plasma source into the coating chamber for supporting the ionization and/or excitation of the metallic components.

8. The method according to claim 1, wherein the substrate or the back contact is biased by a direct voltage or alternating voltage.

9. The method according to claim 1, wherein the metallic components are already present as a binary compound before striking onto the substrate.

10. The method according to claim 2, wherein the Cu is or partially exchanged by Ag, the Ga is partially exchanged by Al and the Se is partially exchanged by S or Te.

11. The method according to claim 2, wherein Cu, In and/or Ga are deposited as precursor layers using the ion source operated with an inert gas, and a $Cu(In,Ga)(Se,S)_2$ absorber layer is not produced until the striking of the ion beam in a second step.

12. The method according to claim 3, wherein Cu, In and/or Ga are deposited as precursor layers using the ion source operated with an inert gas, and a $Cu(In,Ga)(Se,S)_2$ absorber layer is not produced until the striking of the ion beam in a second step.

* * * * *

UNITED STATES PATENT AND TRADEMARK OFFICE
CERTIFICATE OF CORRECTION

PATENT NO.        : 8,956,906 B2
APPLICATION NO.   : 13/580243
DATED             : February 17, 2015
INVENTOR(S)       : Hendrik Zachmann et al.

It is certified that error appears in the above-identified patent and that said Letters Patent is hereby corrected as shown below:

In the Claims

In Col. 6, Line 1, Claim 1, delete "$1\times10^{4}$" and insert --$1\times10^{-4}$--.

In Col. 6, Line 50, Claim 10, after "is", delete "or".

Signed and Sealed this
Thirtieth Day of June, 2015

Michelle K. Lee
*Director of the United States Patent and Trademark Office*